United States Patent
Preiss et al.

(10) Patent No.: US 10,864,925 B2
(45) Date of Patent: Dec. 15, 2020

(54) POWER CAR FOR HIGH-SPEED TRAIN

(71) Applicant: SpeedInnov, Paris (FR)

(72) Inventors: Paul Preiss, Reichshoffen (FR); Pierre Debost, Genevilliers (FR); Etienne Grappein, Uffholtz (FR); Marion Faverger, Belfort (FR)

(73) Assignee: SPEEDINNOV, Paris (FR)

( * ) Notice: Subject to any disclaimer, the term of this patent is extended or adjusted under 35 U.S.C. 154(b) by 216 days.

(21) Appl. No.: 16/117,865

(22) Filed: Aug. 30, 2018

(65) Prior Publication Data
US 2019/0061786 A1 Feb. 28, 2019

(30) Foreign Application Priority Data

Aug. 30, 2017 (FR) ..................................... 17 57996

(51) Int. Cl.
| | | |
|---|---|---|
| *B61C 17/04* | (2006.01) | |
| *B61C 3/00* | (2006.01) | |
| *H02K 9/04* | (2006.01) | |
| *H05K 7/20* | (2006.01) | |
| *B61D 27/00* | (2006.01) | |

(52) U.S. Cl.
CPC ............... *B61C 17/04* (2013.01); *B61C 3/00* (2013.01); *B61D 27/009* (2013.01); *B61D 27/0018* (2013.01); *H02K 9/04* (2013.01); *H05K 7/20909* (2013.01)

(58) Field of Classification Search
CPC ......... B61C 17/00; B61C 17/02; B61C 17/04; B61C 3/00; B61D 27/0018; B61D 27/0027; B61D 27/009; H02K 9/04
See application file for complete search history.

(56) References Cited

U.S. PATENT DOCUMENTS

| | | | | |
|---|---|---|---|---|
| 4,907,645 A | * | 3/1990 | Dumas | .................. B61C 5/02 |
| | | | | 165/41 |
| 5,544,012 A | * | 8/1996 | Koike | ............... H05K 7/20572 |
| | | | | 361/695 |
| 6,238,282 B1 | * | 5/2001 | Kindel | .............. B60H 1/00564 |
| | | | | 454/84 |
| 6,431,081 B2 | * | 8/2002 | Mary | ..................... B61C 17/04 |
| | | | | 105/59 |

(Continued)

FOREIGN PATENT DOCUMENTS

| | | |
|---|---|---|
| EP | 2078655 | 7/2009 |
| WO | WO-2012060139 | 5/2015 |

OTHER PUBLICATIONS

Preliminary Search Report for FR 1757996, dated Feb. 8, 2018.

*Primary Examiner* — Jason C Smith
(74) *Attorney, Agent, or Firm* — B. Aaron Schulman, Esq.; Stites & Harbison PLLC

(57) ABSTRACT

The present invention relates to a power car for a high-speed train, including: a body; a traction motor; a rheostatic brake; a first ventilation device of said rheostatic brake; electrical control equipment; and a second ventilation device for said electrical equipment. The first ventilation device comprises a first air intake sheath, the inlet and outlet of which are located on the roof of the body. The second ventilation device comprises a second sheath, the inlet and outlet of which are respectively located on the roof of the body and below the body. Each ventilation device comprises a fan arranged in one of the sheaths.

9 Claims, 3 Drawing Sheets

(56) References Cited

U.S. PATENT DOCUMENTS

| | | | | |
|---|---|---|---|---|
| 2014/0346287 | A1* | 11/2014 | Billig | B61L 3/127 |
| | | | | 246/187 A |
| 2015/0158504 | A1* | 6/2015 | Do | B61D 27/009 |
| | | | | 454/84 |
| 2015/0191182 | A1* | 7/2015 | Abou Eid | F25D 21/06 |
| | | | | 62/80 |
| 2016/0134177 | A1* | 5/2016 | Itoh | B61C 3/00 |
| | | | | 105/59 |
| 2017/0167083 | A1* | 6/2017 | Hansen | B61C 17/04 |
| 2018/0251138 | A1* | 9/2018 | Debost | B61C 3/00 |
| 2019/0061786 | A1* | 2/2019 | Preiss | B61D 27/0018 |
| 2019/0061787 | A1* | 2/2019 | Preiss | B61D 27/0018 |
| 2019/0185023 | A1* | 6/2019 | Zueger | B61C 7/04 |

* cited by examiner

A-A

POWER CAR FOR HIGH-SPEED TRAIN

CROSS REFERENCE

This application claims the benefit of French Patent Application FR 17 57996, filed on Aug. 30, 2017 and hereby incorporated by reference herein.

TECHNICAL FIELD OF THE INVENTION

The present invention relates to a power car for a high-speed train, in particular for transporting passengers, of the type including a body and at least one traction motor for said body, said body comprising a roof and a floor, the at least one traction motor being arranged below said floor, the body further comprising: a rheostatic brake arranged in the upper part of said body; and a first ventilation device of said rheostatic brake; the body further comprising: electrical equipment for controlling the at least one traction motor; and a second ventilation device for said electrical equipment.

The invention in particular applies to transporting passengers. A high-speed train includes one or several power cars, most often one at each raft end, and a certain number of passenger cars.

BACKGROUND OF THE INVENTION

In the current high-speed trains, the ventilation of the electrical equipment of the power cars is provided through aeration orifices arranged inside walls of said power cars. The movement of the raft generates a flow of air that cools said electrical equipment. However, such a ventilation system exposes the electrical equipment to outside dust, humidity, or even snow.

In order to eliminate the side openings, it is known to arrange the air inlets and outlets on the roof, as for example described in document FR 3,014,396, in the Applicant's name.

However, the cooling device described in this document requires a minimal installation length. It is therefore incompatible with producing a short power car.

Furthermore, the cooling of certain pieces of equipment, such as the rheostatic brake, leads to discharging air at a high temperature. The presence of this hot air may be detrimental to the cooling of certain other pieces of equipment of the power car.

SUMMARY OF THE INVENTION

The present invention aims to resolve these problems. To that end, the invention relates to a power car for a high-speed train of the aforementioned type, wherein: the first ventilation device comprises a first air intake sheath, forming a closed pipe between an inlet and an outlet; said inlet and outlet being located respectively in line with a first and second air inlet mouth located on the roof of the body; the second ventilation device comprises a second air intake sheath, forming a closed pipe between an inlet and an outlet; said inlet and outlet being located in line, respectively, with a third air inlet mouth located on the roof of the body and a fourth air inlet mouth located below the floor of the body; and each of the first and second ventilation devices comprises a fan arranged between the inlet and the outlet, respectively of the first and second sheath.

According to other advantageous aspects of the invention, the power car includes one or more of the following features, considered alone or according to all technically possible combinations:

the body further comprises at least one third ventilation device, said third ventilation device comprising a third air intake sheath, forming a closed pipe between an inlet and an outlet, the inlet of the third sheath being arranged on the roof of the body;

the third ventilation device comprises a third electric fan arranged in the third sheath;

the body further comprises at least one fourth ventilation device, said fourth ventilation device comprising a fourth air intake sheath, forming a closed pipe between an inlet and an outlet, the inlet of the fourth sheath being arranged on the roof of the body;

the fourth ventilation device comprises a fourth electric fan arranged in the fourth sheath;

the body comprises an equipment room receiving electrical and/or electronic equipment of the power car; and the outlet of the third sheath is arranged inside said equipment room;

the outlet of the third sheath is open below the floor of the body, across from the at least one traction motor;

the power car for a high-speed train further includes an electrical transformer connected to the at least one traction motor; said transformer being connected to a radiator located below the floor of the body; the outlet of the second sheath of the second ventilation device emerging across from said radiator.

BRIEF DESCRIPTION OF THE DRAWINGS

The invention will be better understood upon reading the following description, provided solely as a non-limiting example and done in reference to the drawings, in which.

DETAILED DESCRIPTION OF SOME EMBODIMENTS

Figure 1:
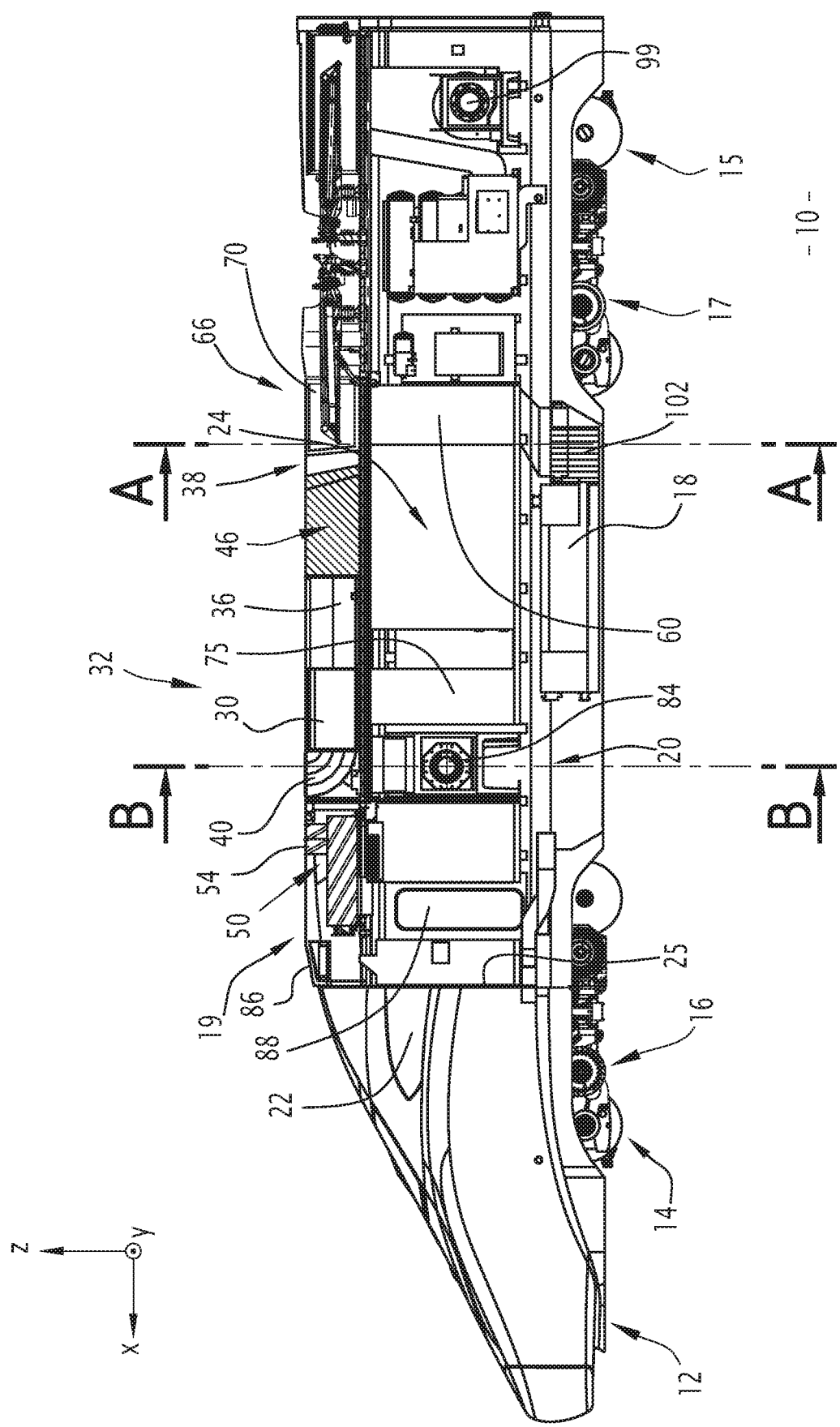
FIG. 1 is a partial longitudinal sectional view of a power car according to one embodiment of the invention.

FIG. 1 shows a power car 10 of a high-speed train, according to one embodiment of the invention. The power car 10 is intended to be assembled to railway vehicles of the passenger transport car type, to form a train.

The power car 10 includes a body 12, as well as two bogies 14, 15 and two traction motors 16, 17, arranged below said body 12. Each traction motor 16, 17 is intended to set the wheels of one of the bogies 14, 15 in motion. The power car 10 further includes an electric transformer 18, connected to the traction motors 16, 17 and also arranged below the body 12.

Figure 2:
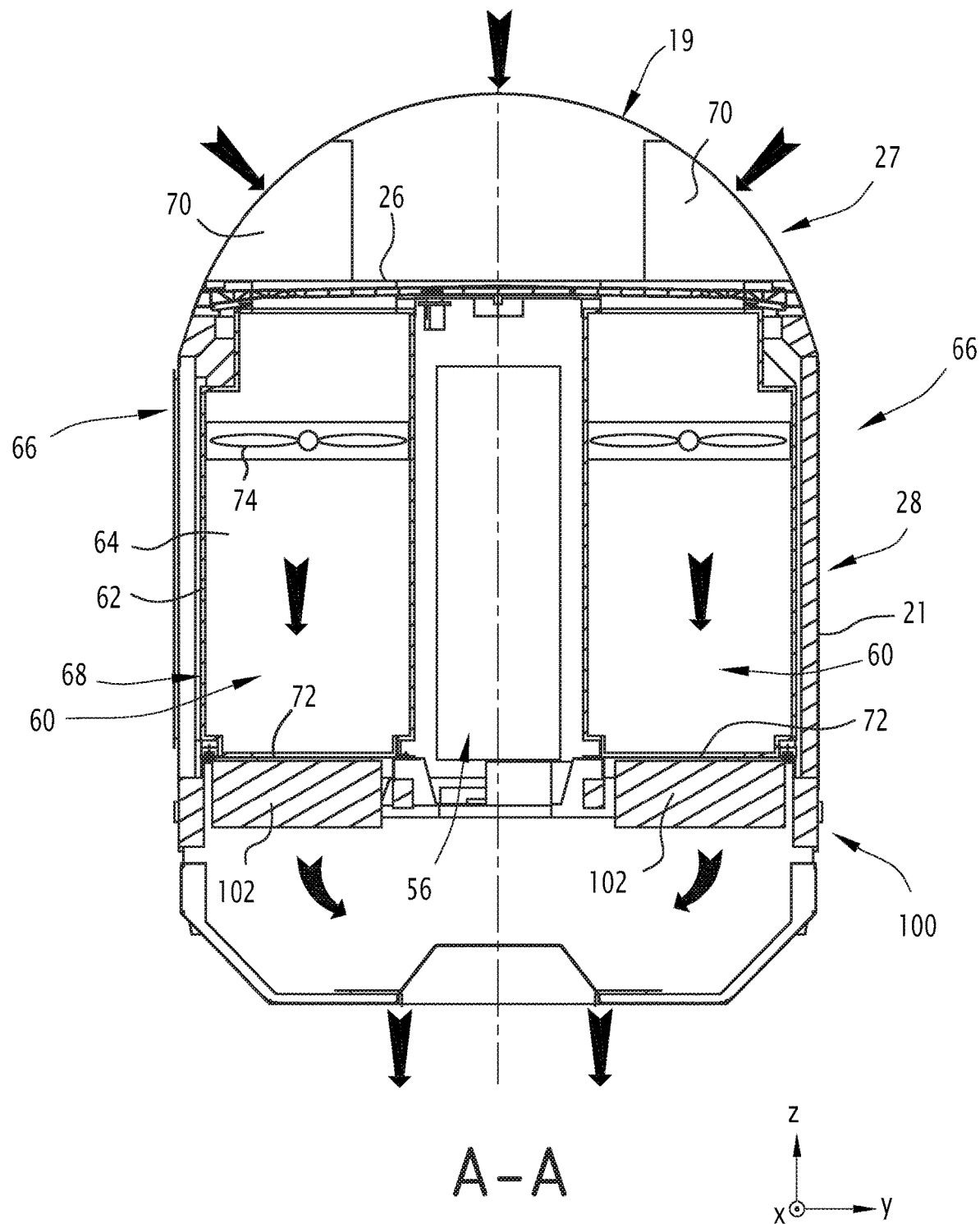
FIGS. 2 and 3 are cross-sectional views of the power car of FIG. 1.

The body 12 comprises a roof 19 and a floor 20, which vertically delimit said body. The bogies 14, 15 and the traction motors 16, 17 are arranged below the floor 20. The body 12 further comprises side walls 21 (FIG. 2).

The body 12 has an elongated shape. An orthonormal coordinate system (X, Y, Z) is considered, the direction Z representing the vertical. The body 12 extends primarily along the direction X, corresponding to a typical movement direction of the power car 10. The body 12 comprises a front end, formed by a driving cabin 22.

The first bogie 14 and a first traction motor 16 are located close to said front end of the body 12. A second bogie 15 and a second traction motor 17 are located close to an opposite rear end of the body 12.

Adjacent to the driving cabin 22 along X, the body 12 comprises an equipment compartment 24. Said equipment compartment is separated from the driving cabin 22 by a partition 25. The equipment compartment 24 is shown in sectional view in FIG. 1.

Figure 3:
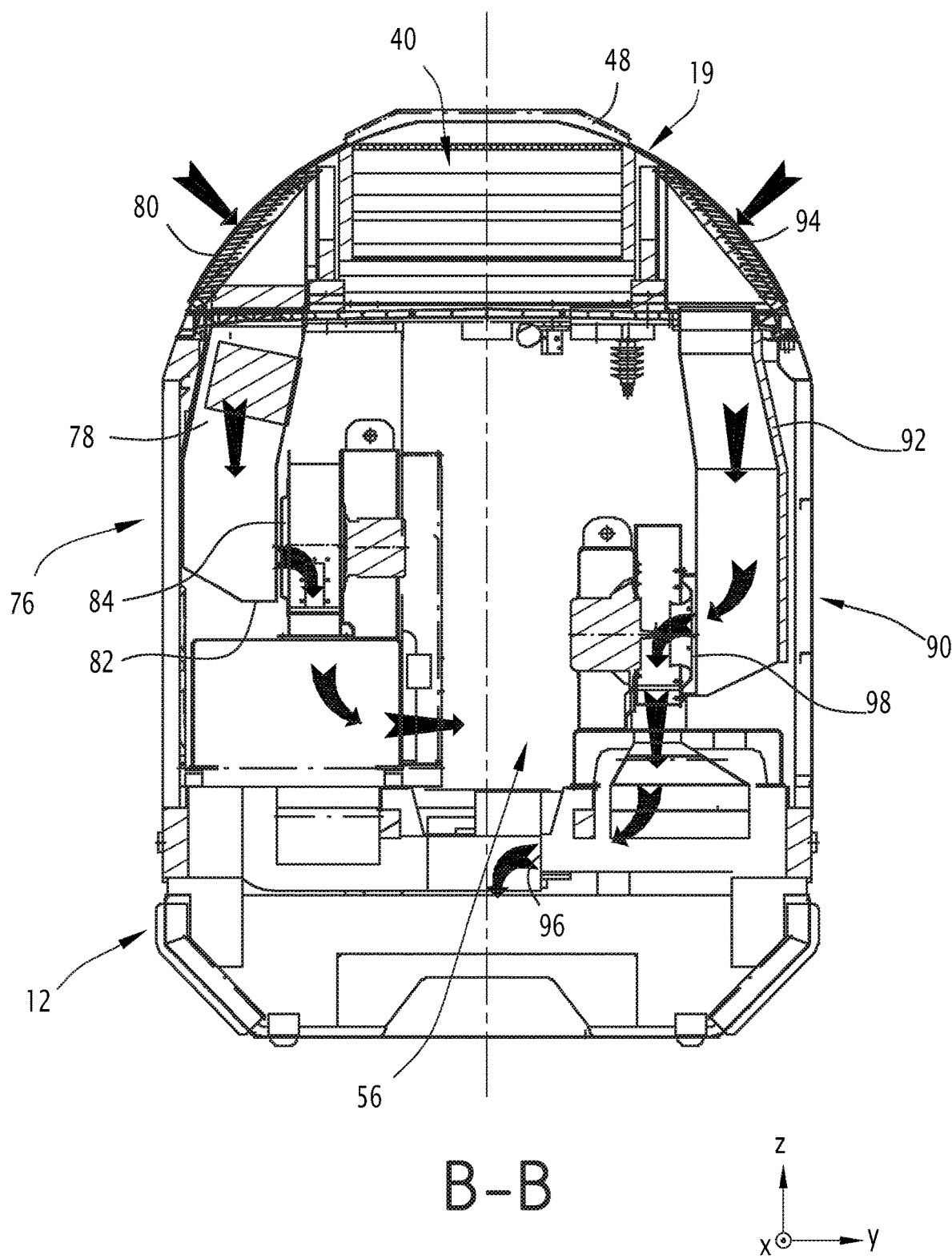

FIGS. 2 and 3 show cross-sectional views of the body 12, at said equipment compartment 24, in cutting planes A-A and B-B indicated in FIG. 1.

In a plane (X, Z), the equipment compartment 24 is delimited by the roof 19, the floor 20 and the side walls 21. The equipment compartment 24 comprises a ceiling 26, which divides it along Z between an upper level 27 and a lower level 28. The ceiling 26 in particular marks a boundary along Z between the side walls 21 and the roof 19, said side walls 21 being substantially planar and vertical and said roof 19 having a domed shape.

The upper level 27 of the equipment compartment 24 comprises a rheostatic brake 30, substantially arranged between the traction motors 16 and 17 along the direction X. The upper level 27 further comprises a first ventilation device 32 of the rheostatic brake 30.

The first ventilation device 32 comprises a first air intake sheath 36, substantially arranged along the direction X. Said first sheath 36 forms a closed pipe, with the exception of an inlet and an outlet that are located at the roof 19 of the body 12. More specifically, the inlet and the outlet of the first sheath 36 are formed, respectively, by a first air inlet mouth 38 and by a second air outlet mouth 40, which are incorporated into the roof 19.

The first ventilation device 32 further comprises a first electric fan 46, which is capable of generating a flow of air between the inlet and the outlet of the first sheath 36. Said first fan 46 and the rheostatic brake 30 are arranged inside said first sheath 36.

The presence of the fan 46 in particular makes it possible to reduce the length of the first sheath 36 relative to the device described in document FR 3,014,396.

Preferably, the first ventilation device 32 comprises mechanical deflector elements, such as louvers 48, at the first 38 and/or the second 40 air inlet mouth, so as to limit the penetration of solid particles into the first sheath 36.

The upper level 27 of the equipment compartment 24 further comprises an HVAC system 50 (Heat Ventilation Air conditioning and Cooling) capable of providing air-conditioning to the driving cabin 22. The HVAC system 50 is located near the partition 25.

The HVAC system 50 is fluidly isolated from the rest of the equipment compartment 24 and comprises a third air inlet mouth (not shown) and a fourth air outlet mouth 54, incorporated into the roof 19. The HVAC system 50 also comprises a blower device (not shown) capable of providing a movement of air at said air inlet and outlet mouths 54. The HVAC system 50 also comprises communication pipes (not shown) passing through the partition 25 and configured to exchange air with the driving cabin 22.

The lower level 28 of the equipment compartment 24 comprises a central corridor 56. Advantageously, said central corridor has a width along Y between 500 mm and 750 mm, preferably equal to about 750 mm. This width is determined to allow an operator to pass comfortably, without significantly limiting the available space for the equipment of the power car.

The lower level 28 further comprises two cooling towers 60, located on either side of the central corridor 56 and extending substantially along Z. The cooling towers 60 are substantially arranged above the electric transformer 18. The cooling towers 60 are visible in sectional view in FIG. 2.

Each cooling tower 60 comprises an outer enclosure 62 that extends from the floor 20 to the ceiling 26, fluidly isolating said towers 60 from the atmosphere of the central corridor 56.

A traction box 64 is received inside each outer enclosure 62. Said traction box 64 includes electrical and/or electronic equipment for controlling the traction motors 16, 17.

The lower level 28 further comprises at least one second ventilation device 66, associated with a cooling tower 60. In the embodiment of FIGS. 1 to 3, each cooling tower 60 is associated with a separate second ventilation device 66. A single second ventilation device 66 will be described below.

The second ventilation device 66 comprises a second air intake sheath 68. Said second sheath 68 forms a closed conduit, with the exception of an inlet 70 and an outlet 72.

The inlet 70 is arranged at the roof 19 and preferably formed by an air inlet mouth, similar to the first air inlet mouth 38 of the first ventilation device 32.

From the inlet 70, the second sheath 68 extends in the upper level 27 of the equipment compartment 24, passes through the ceiling 26 and continues in the lower level 28, where it is embodied by the outer enclosure 62 of the cooling tower 60. The outlet 72 of the second sheath 68 emerges below the floor 20, near the electrical transformer 18.

The second ventilation device 66 further comprises a second electric fan 74, located in the cooling tower 60 and which is capable of generating a flow of air between the inlet 70 and the outlet 72.

The lower level 28 further comprises a plurality of pieces of technical equipment 75, installed on either side of the central corridor 56 near the side walls 21. Said pieces of technical equipment are for example high-voltage cabinets and/or low-voltage cabinets.

The lower level 28 further comprises a third ventilation device 76, making it possible to blow cool air inside said lower level 28, in particular in order to cool the technical equipment 75. The third ventilation device 76 is shown in sectional view in FIG. 3.

The third ventilation device 76 comprises a third air intake sheath 78, forming a closed pipe with the exception of an inlet 80 and an outlet 82. The inlet 80 is arranged at the roof 19 and preferably formed by an air inlet mouth, similar to the first air inlet mouth 38 of the first ventilation device 32. The outlet 82 is arranged in the lower level 28.

The third ventilation device 76 further comprises a third electric fan 84, located in the lower level 28 at the outlet 82. The third fan 84 is able to inject air from outside the body 12 into the lower level 28.

The third ventilation device 76 further comprises at least one air outlet mouth 86 (FIG. 1), located on the roof 19 of the body 12 and in fluid communication with the lower level 28 of the equipment compartment 24.

The aspiration of the air from the roof 19 instead of aspiration on the side walls 21 in particular makes it possible to reduce the noise with respect to the outside.

Preferably, the third ventilation device 76 is located at the front of the equipment compartment 24; furthermore, the body 12 comprises a fourth ventilation device (not shown), similar to the third ventilation device 76 and intended to cool the back of the equipment compartment 24. The fourth ventilation device is located on the other side of the corridor 56 behind the equipment compartment 24.

The equipment compartment 24 comprises at least one opening arranged in a side wall 21 and closed off reversibly by a door 88. Said door 88 provides access from the outside of the central corridor 32 of the lower level 28. Preferably, the side walls 21 do not comprise any permanently clear opening. Aside from limiting the pollution of the equipment compartment 24, such side walls with no opening are more aesthetically pleasing and allow greater design freedom.

The body 12 of the power car 10 comprises at least one fifth ventilation device 90, intended to cool the first traction motor 16. The fifth ventilation device 90 comprises a fifth air intake sheath 92, forming a closed pipe with the exception of an inlet 94 and an outlet 96. The fifth sheath 92 is arranged across from the third sheath 78 relative to the central corridor 56 of the equipment compartment 24, as shown in FIG. 3.

The inlet 94 is arranged at the roof 19 and preferably formed by an air inlet mouth, similar to the first air inlet mouth 38 of the first ventilation device 32. The outlet 96 is arranged below the floor 20.

The fifth ventilation device 90 further comprises a fifth electric fan 98, located in the lower level 28 at the fifth sheath 92.

The fifth sheath 92 is fluidly isolated from the equipment compartment 24. In other words, there is no direct exchange inside the body 12 between the air circulating in the fifth sheath 92 and the ambient air of the equipment compartment 24. Thus, any dust conveyed by the air circulating in the fifth sheath 92 is prevented from polluting the equipment compartment 24.

Preferably, the body 12 further comprises a sixth ventilation device 99, similar to the fifth ventilation device 90 and intended to cool the second traction motor 17.

In all of the ventilation devices 32, 66, 76, 90, 99 described above, the air inlet mouths located on the roof 19 are preferably positioned in high-pressure zones to promote suction. Furthermore, each ventilation device has its own fan 46, 74, 84, 98 and is thus independent.

The body 12 of the power car 10 further comprises a device 100 for cooling the electric transformer 18. Said cooling device 100 comprises two radiators 102, connected to the electric transformer 18 by a coolant circuit. Each radiator 102 is arranged below the floor 20, across from the outlet 72 of the second sheath 68 associated with a cooling tower 60. Thus, the flow of air generated by the second fan 74 contributes to cooling the electric transformer 18.

The invention claimed is:

1. A power car for a high-speed train, said power car comprising a body and at least one traction motor of said body,
said body comprising a roof and a floor; the at least one traction motor being arranged under said floor,
the body further comprising:
a rheostatic brake arranged in an upper part of said body;
a first ventilation device of said rheostatic brake;
electrical equipment for controlling the at least one traction motor; and
a second ventilation device of said electrical equipment;
wherein:
the first ventilation device comprises a first air intake sheath forming a closed pipe between an inlet and an outlet of the first air intake sheath; said inlet and outlet of the first air intake sheath being located respectively at the level of a first and second air inlet mouth located on the roof of the body;
the second ventilation device comprises a second air intake sheath forming a closed pipe between an inlet and an outlet of the second air intake sheath; said inlet and outlet of the second air intake sheath being located respectively at the level of a third air inlet mouth located on the roof of the body and a fourth air inlet mouth located under the floor of the body; and
each of the first and second ventilation devices comprises a fan arranged between each of said inlets and outlets, respectively of the first and second air intake sheaths.

2. The power car for a high-speed train according to claim 1, wherein the body further comprises at least a third ventilation device, said third ventilation device comprising a third air intake sheath, forming a closed pipe between an inlet and an outlet of the third air intake sheath, the inlet of the third air intake sheath being arranged on the roof of the body.

3. The power car for a high-speed train according to claim 2, wherein the third ventilation device comprises a third electric fan arranged in the third air intake sheath.

4. The power car for a high-speed train according to claim 2, wherein the body further comprises at least a fourth ventilation device, said fourth ventilation device comprising a fourth air intake sheath, forming a closed pipe between an inlet and an outlet of the fourth air intake sheath,
the inlet of the fourth air intake sheath being arranged on the roof of the body.

5. The power car for a high-speed train according to claim 4, wherein the fourth ventilation device comprises a fourth electric fan arranged in the fourth air intake sheath.

6. The power car for a high-speed train according to claim 2, wherein:
the body comprises an equipment room receiving electrical and/or electronic equipment of the power car; and
the outlet of the third air intake sheath is arranged inside said equipment room.

7. The power car for a high-speed train according to claim 2, wherein the outlet of the third air intake sheath is open under the floor of the body, opposite the at least one traction motor.

8. The power car for a high-speed train according to claim 1, further including an electrical transformer connected to the at least one traction motor;
said transformer being connected to a radiator located under the floor of the body;
the outlet of the second air intake sheath of the second ventilation device opening opposite said radiator.

9. The power car for a high-speed train according to claim 1 wherein said train is configured for transporting passengers.

* * * * *